United States Patent [19]
Ghaem et al.

[11] Patent Number: 6,046,910
[45] Date of Patent: Apr. 4, 2000

[54] MICROELECTRONIC ASSEMBLY HAVING SLIDABLE CONTACTS AND METHOD FOR MANUFACTURING THE ASSEMBLY

[75] Inventors: Sanjar Ghaem, Palatine; Cindy Melton, Bolingbrook, both of Ill.

[73] Assignee: Motorola, Inc., Schaumburg, Ill.

[21] Appl. No.: 09/040,568

[22] Filed: Mar. 18, 1998

[51] Int. Cl.[7] .............................. H05K 7/02; H05K 1/14; H01L 23/12; H01L 23/488

[52] U.S. Cl. ........................ 361/760; 174/260; 29/834; 257/785; 257/797; 361/767; 361/769; 361/771; 361/783

[58] Field of Search .............................. 29/832, 834, 836, 29/840, 841, 854, 855; 174/259, 260, 261, 138 G; 228/180.21, 180.22; 257/737, 738, 772, 778, 780, 783, 785, 797; 361/760, 767, 768, 769, 771, 782, 783; 438/108, 117, 118, 401, 462, 612; 439/68, 70, 71, 83

[56] References Cited

U.S. PATENT DOCUMENTS

| | | | |
|---|---|---|---|
| 3,842,189 | 10/1974 | Southgate | 257/785 |
| 4,056,681 | 11/1977 | Cook, Jr. | 174/260 |
| 4,647,959 | 3/1987 | Smith | 257/785 |
| 4,949,148 | 8/1990 | Bartelink | 257/797 |
| 5,214,308 | 5/1993 | Nishiguchi et al. | 257/738 |
| 5,302,854 | 4/1994 | Nishiguchi et al. | 257/737 |
| 5,331,513 | 7/1994 | Hirai et al. | 257/785 |
| 5,528,461 | 6/1996 | Gore et al. | 361/760 |
| 5,657,207 | 8/1997 | Schreiber et al. | 361/760 |

*Primary Examiner*—Donald Sparks
*Attorney, Agent, or Firm*—Douglas D. Fekete

[57] ABSTRACT

A microelectronic assembly and a method for manufacturing the assembly include an integrated circuit component attached to a substrate via polymeric bodies. The integrated circuit component has bond pads that are bonded to corresponding conductive members. The substrate contains terminals associated with conductive traces. The conductive members rest against the respective terminals to form slidable electrical contacts. The slidable electrical contacts permit the transfer of electrical energy between the integrated circuit component and the conductive traces of the substrate. The polymeric bodies preferably comprise elastomers that are spaced from the conductive members, rather than underfilling the integrated circuit component.

36 Claims, 6 Drawing Sheets

MICROELECTRONIC ASSEMBLY HAVING SLIDABLE CONTACTS AND METHOD FOR MANUFACTURING THE ASSEMBLY

BACKGROUND OF THE INVENTION

The present invention relates to a microelectronic assembly. More specifically, the present invention relates to a microelectronic assembly having slidable electrical contacts between an integrated circuit component and a substrate.

A typical microelectronic assembly includes an integrated circuit component mounted onto a substrate, such as a printed circuit board, by solder joints. The integrated circuit component may be a flip-chip with bond pads arranged on a face that faces the substrate. The face is spaced apart from the substrate by a gap. The substrate includes terminals opposite the bond pads. The bond pads are aligned with the terminals on the substrate. The bond pads and the corresponding terminals are electrically and mechanically connected through solder joints commonly referred to as solder bumps. The gap is commonly filled with an encapsulant to reduce stress upon the solder bumps.

Semiconductor manufacturers historically have increased the density of solder bumps on flip-chips. However, as adjacent solder bumps are placed closer together, adjacent solder joints tend to merge or contact one another during reflow creating electrical short circuits; hence, defective microelectronic assemblies. Electrical short circuits are particulary troublesome in the manufacturing of microelectronic assemblies using fine-pitch flip-chips. In practice, conventional solder bumps frequently do not offer acceptable manufacturing reliability or yields for fine pitch interconnections of 153 microns or less.

Conventional solder bump interconnections form generally rigid joints that may fail when exposed to sufficient thermal or mechanical stress during manufacturing or use of the microelectronic assembly. For example, during operation of a microelectronic assembly, the microelectronic assembly may be subjected to a temperature increase that cause the integrated circuit component to expand at a different rate than the substrate does. That is, the substrate and the integrated circuit component typically have different coefficients of thermal expansion. Thus, even if the same degree of heat is applied to the substrate and the integrated circuit die, the rigid solder joints are subjected to stress which may lead to breakage of solder joints and open circuits.

An integrated circuit die is often difficult to remove from the microelectronic assembly without damaging it. Removal of an integrated circuit component typically involves heating multiple solder bumps, which may thermally damage the integrated circuit component and any surrounding electrical components on the substrate. The integrated circuit component is typically affixed to the substrate by an underfilling encapsulant after soldering to reduce stress on the solder joints. Accordingly, removal of the integrated circuit die requires the arduous separation of the integrated circuit die from the underfilling encapsulant that binds the integrated circuit die to the substrate.

Thus, a need exists for a microelectronic assembly and an interconnection method that provides reliable, stress-tolerant electrical interconnections, while featuring a readily-removable integrated circuit component. In addition, a need exists for a microelectronic assembly and a method for producing reliable and stress-tolerant electrical interconnections, which are well-suited for fine pitch technology with flip-chips having fine pitches of less than or equal to 153 microns.

SUMMARY OF THE PRESENT INVENTION

This invention relates to a microelectronic assembly with slidable electrical contacts between an integrated circuit component and a substrate, and a method for manufacturing the microelectronic assembly. In a preferred embodiment, the microelectronic assembly includes a substrate and an integrated circuit component secured to the substrate through polymeric bodies. The substrate has terminals arranged in a first pattern. The integrated circuit component has a face facing the substrate and perimetric sides about the face. The integrated circuit component includes bond pads arranged in a second pattern on the face. The second pattern corresponds to the first pattern. The assembly also comprises conductive members that are bonded and electrically coupled to the bond pads. The conductive members rest against the respective terminals to form slidable electrical contacts. The slidable electrical contacts permit the transfer of electrical energy between the bond pads and the terminals to electrically couple the integrated circuit component to a circuit associated with the substrate. The polymeric bodies adhere to the perimetric sides of the integrated circuit component and to the substrate. In a preferred embodiment, the integrated circuit component has a rectangular shape with corners formed by the intersection of the perimetric sides. Furthermore, the polymeric bodies are preferably located at two or more of the corners. The polymeric bodies are preferably spaced from the conductive members.

Slidable electrical contacts are electrical junctions of the terminals and the conductive members which may resiliently yield to applied stress without sacrificing electrical continuity between the terminals and the conductive members. While the conductive members and the terminals are not bonded together by solder or a conductive adhesive, the conductive members and the terminals sufficiently touch and overlap one another to maintain reliable electrical junctions.

The slidable contacts accommodate stress which would otherwise tend to damage or fracture solder joints. The contacts accommodate differential thermal coefficients of expansion of the integrated circuit component and the substrate. The contacts may yield laterally in response to a force applied laterally to the integrated circuit component, while maintaining electrical continuity between the respective conductive members and the terminals. The microelectronic assembly advantageously eliminates the need for underfilling encapsulant commonly employed in the prior art to reinforce rigid solder joints between a flip-chip and a circuit board.

The slidable contacts are particularly well-suited for producing reliable electrical connections for fine-pitch flip-chips. The slidable contacts do not require reflowing or heating of the solder to form solder joints between the conductive members and the terminals. Thus, the likelihood of electrical shorts between adjacent leads or bumps may be drastically reduced over the prior art.

The polymeric bodies preferably contact the substrate in a limited region about the integrated circuit component in contrast to filing the entire gap with underfilling encapsulant. Accordingly, the integrated circuit component of the present invention may be readily removed from the substrate by removing readily-accessible polymeric bodies adhering to the perimetric sides. Moreover, the polymeric bodies may be formed of a thermoplastic elastomer that is readily removed by heating. Thus, this invention permits microelectronic assemblies to be readily repaired by facilitating the removal and replacement of the integrated circuit component.

Another aspect of this invention is a method for fabricating a microelectronic assembly. The method comprises the step of fabricating an integrated circuit component having bond pads arranged in a pattern; attaching conductive members onto the bond pads; superposing the integrated circuit component onto a substrate having terminals disposed in another pattern, and dispensing polymeric material to form polymeric bodies at sites about perimetric sides of the integrated circuit component to form slidable electrical junctions between the respective conductive members and the terminals.

DETAILED DESCRIPTION OF THE PREFERRED EMBODIMENTS

This invention relates to a microelectronic assembly and a method for fabricating the microelectronic assembly. The microelectronic assembly generally comprises an integrated circuit component electrically connected to a substrate via slidable electrical contacts. The slidable contacts form a compliant, bond-free electrical junction between terminals on the substrate and the leads, or pads, of the integrated circuit component.

Figure 1:
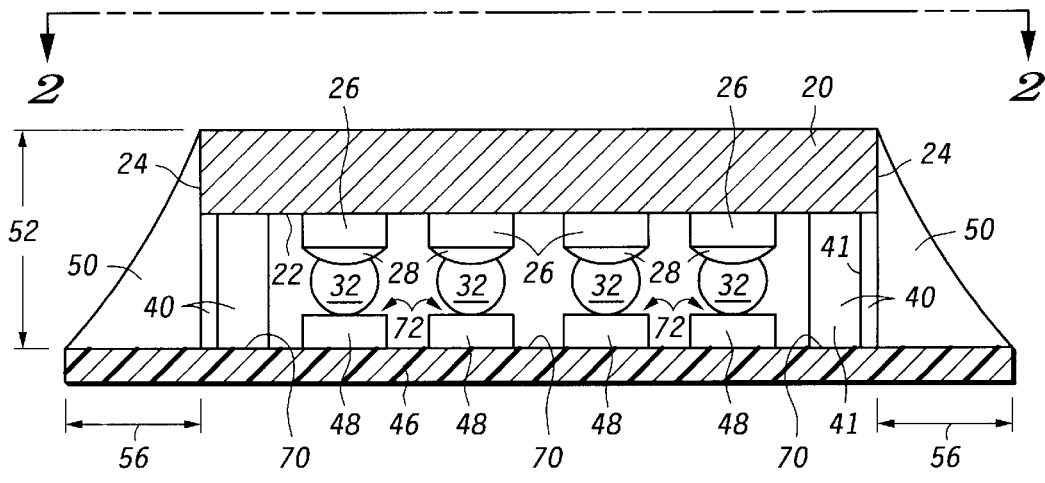
FIG. 1 is a cross-sectional view of a first embodiment of the microelectronic assembly of this invention showing conductive members of an integrated circuit component and terminals of a substrate forming slidable electrical contacts.
Figure 2:
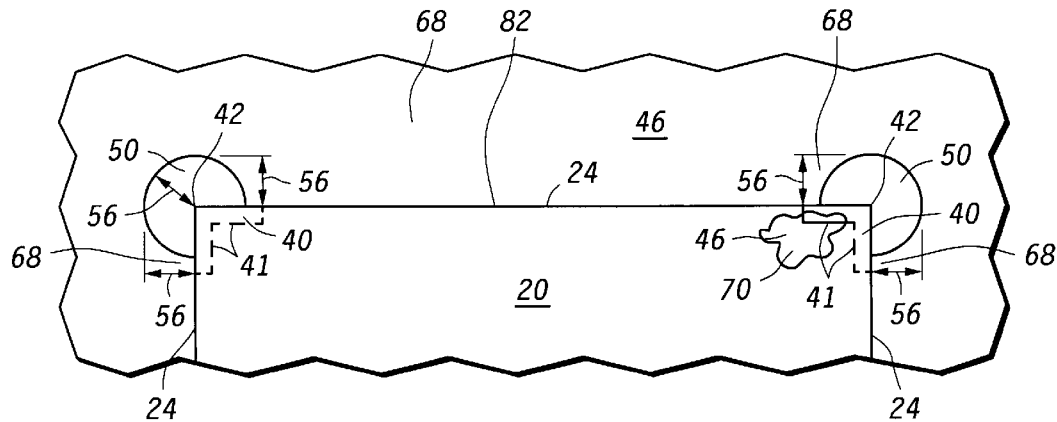
FIG. 2 is a sectional plan view showing a portion of the microelectronic assembly as viewed along reference line 2—2 of FIG. 1 in the direction of the arrows.

Referring to FIG. 1 and 2, a first embodiment of the microelectronic assembly 21 generally includes a substrate 46, an integrated circuit component 20, conductive members, and polymeric bodies 50.

The substrate 46 preferably comprises a printed circuit board (PCB) or a printed wiring board (PWB). The printed circuit board may be constructed from ceramic material, a polymer, a fiber-filled organic resin (i.e. FR4), or the like. In alternate embodiments, an alternate substrate may comprise a carrier or an interposer. A carrier or an interposer is a holder or a mounting interface for integrated circuit components. For example, a carrier may be a first (smaller) circuit board for interfacing ball grid array (BGA) package to a second (larger) circuit board.

The substrate 46 has terminals 48 arranged in a first pattern. The terminals 48 comprise pads that are associated with conductive traces of the substrate 46. The conductive traces comprise metallic conductors, metallic traces, vias, plated holes, or the like. The terminals 48 are suitably formed of a metal, preferably copper, nickel, tin, aluminum, or alloys of the foregoing. Each terminal 48 is preferably coated with a corrosion-resistant metallic film, such as a noble metal layer.

The substrate 46 includes a component-attach region 68 outboard from a component-shadow region 70. The component-shadow region 70 has its boundaries coextensive with the integrated circuit component 20. That is, the component-shadow region 70 is defined by projecting a perimetric outline 82 of the integrated circuit component 20 onto the substrate 46.

In a preferred embodiment, the integrated circuit component 20 comprises a semiconductor die having bond pads 26. The bond pads 26 are electrically coupled to conductive internal interconnections (not shown) and other internal electrical features (not shown) within the semiconductor die. In alternate embodiments, the integrated circuit component 20 may be packaged as a ball-grid-array (BGA) package, a fine-pitch ball-grid-array (FBGA) package, a direct-chip-attach (DCA) package, a chip-on-board (COB) package, a fine-pitch chip-on-board (FCOB) package, a surface-mount package, or the like.

In accordance with the first embodiment of FIG. 1 and FIG. 2, the integrated circuit component 20 has a face 22, one or more perimetric sides 24, and bond pads 26. The face 22 faces the substrate 46 and is bounded by the perimetric sides 24. The bond pads 26 are arranged in a second pattern on the face 22. The second pattern of the bond pads 26 generally corresponds to the first pattern of the terminals 48 and when the component 20 is superposed on the substrate 46, each pad spatially registers with a corresponding terminal 48.

The bond pads 26 are adapted to receive conductive members 32. The conductive members 32 are attached to corresponding bond pads 26 by a conductive adhesive 28 or by any other suitable means for producing an electrically conductive, mechanical connection. The conductive members 32 may be composed of a metallic material, a solder material, a metal, an alloy, or a metallic-coated dielectric. Copper, nickel, silver, gold, tin, lead, antimony, bismuth, and alloys of the foregoing, are suitable materials for the conductive members 32. In an alternate embodiment, the conductive members 32 comprise a metallic-coated dielectric, which is preferably a spherical polymeric interior coated or plated with gold, silver, palladium, or other suitable materials.

In FIG. 1 and FIG. 2, conductive members 32 are more particularly shown as spherical conductive members 32. The spherical conductive members 32 are preferably solid metal or solid alloy structures. The conductive members 32 preferably have a lateral diameter of less than or equal to 6 mils.

Suitable conductive adhesives 28 comprise a composite composed of a resin with a conductive filler, such as silver particles, copper particles, aluminum particles, metallic particles, tin-lead particles, alloys of the foregoing metallic particles, or the like. For example, a preferred adhesive is composed of an epoxy resin formed by reacting 100 parts by weight of anahydride epoxy resin with 78 parts by weight of a hexahydrophthalic anhydride (HHPA) curing agent (i.e.

hardener) in the presence of diglycidyl ethers of bisphenol A (DGEBA) catalyst. Metallic particles with a mesh size of 600 are added so that the resultant composite contains 70 percent by weight metallic particles to assure an appropriate conductivity of the resultant conductive adhesive 28.

The terminals 48 and the conductive members 32 are aligned for slidable contact. Slidable contacts 72 are electrical junctions of the terminals 48 and the conductive members 32 which may yield to applied stress without sacrificing electrical continuity between the terminals 48 and the conductive members 32. The polymeric bodies 50 permit slight sliding or compliance between the conductive members 32 and the terminals 48 such that the relatively displaced terminals 48 and conductive members 32 retain electrical continuity. While the conductive members 32 and the terminals 48 are not bonded together by solder or a conductive adhesive, the conductive members 32 and the terminals 48 sufficiently touch and overlap one another to maintain reliable electrical junctions. The slidable contacts 72 are preferably resilient in response to applied stress to the substrate 46 and/or the integrated circuit component 20. The relative position between the conductive members 32 and the terminals 48 is preferably determined by securing a package of the integrated circuit component 20 to the substrate 46.

Each of the slidable electrical contacts 72 includes a first mating surface and a second mating surface opposite the first mating surface. The first mating surface and the second mating surface are electrically connected. The first mating surface, which is located remotely from the bond pad 26, is a tip or an exterior surface of the conductive member 32. The second mating surface is an exterior surface of the terminal 48. The first mating surface and the second mating surface contact one another over a contact area of mutual overlap. In this embodiment, the second mating surface preferably has a larger surface area than the first mating surface to permit lateral movement without the loss of contact and electrical continuity. The first and second mating surfaces may include a corrosion-resistant metallic film, such as noble metal layer, plated onto the conductive members 32 and the terminals 48, respectively.

The polymeric bodies 50 adjoin the substrate 46 and the integrated circuit component 20. This embodiment illustrates an integrated circuit component 20 with a generally rectangular or polyhedral shape. In this embodiment, the polymeric bodies 50 are preferably located at comers 42 formed at the intersections of the perimetric sides 24. Optimally, at a minimum polymeric bodies 50 adjoin at least two diagonally opposite comers 42. In an alternate embodiment, where a curved or rounded integrated circuit component package is used, the polymeric bodies 50 secure the component at 90 degree intervals or less than 90 degree intervals as measured from a geometric center point of the integrated circuit component.

The polymeric bodies 50 preferably adhere to the component-attach region 68 without extending into the component-shadow region 70 so as not to encapsulate the conductive members 32 and unduly restrict their movement. Accordingly, the polymeric bodies 50 optimally do not underfill the integrated circuit component 20 in the gap between the substrate 46 and the integrated circuit component 20. In practice, some minimal intrusion of the polymeric bodies 50 into the component-shadow region 70 may be unavoidable and falls within the scope of this invention.

To minimize or limit intrusion of the polymeric bodies 50 into the component-shadow region 70, one or more polymeric preforms 40 are provided within the gap, between the integrated circuit component 20 and the substrate 46. Each polymeric preform 40 restricts the flow of polymeric precursor into the component-shadow region 70 during formation of the polymeric bodies 50.

Each polymeric preform 40 preferably comprises a form, mold or collar located near a corner 42 of the integrated circuit component 20. More particularly, each polymeric preform 40 is optimally an orthogonal member which optimally has its outer sides 41 coincidental with and beneath the perimetric sides 24 of the integrated circuit component 20. Such a strategic placement of the polymeric preform 40 facilitates contact between the polymeric bodies 50 and the perimetric sides 24. Each polymeric preform 40 is preferably composed of a compressible material which does not significantly interfere with the shrinkage of the polymeric bodies 50 during curing, cooling, or cross-linking. The polymeric material used for the polymeric bodies 50 optimally has a compatibly high viscosity to maximize the effectiveness of the polymeric preforms 40.

To facilitate placement and manufacturing, polymeric preforms 40 may be integrated into a package of the integrated circuit component 20 or affixed to the package. The polymeric preforms 40, that are affixed to the integrated circuit component 20, extend from the integrated circuit component 20 toward the substrate 46. The package may comprise a dielectric encapsulant predominately covering the integrated circuit component 20, a metallic shield for protecting the integrated circuit component, a member for containing the integrated circuit component, or the like. In an alternate embodiment, the alternate preforms may be integrated into the substrate 46 or affixed to the substrate as extensions of the substrate. The alternate preforms would extend from the substrate toward the integrated circuit package.

In a preferred embodiment, the polymeric bodies 50 have a generally semi-conical shape because of the surface tension of the precursors of the polymeric bodies 50. The semi-conical shape is defined by a base extent 56 and a height extent 52. In general, each polymeric body 50 has a maximum base extent 56, on the plane of the substrate 46, within a range from 250 microns to 1500 microns from any perimetric side 24 of the integrated circuit component 20. The maximum base extent 56 is optimally limited to the component-attach region 68. The maximum base extent 56 is selected to keep the circuit density on the substrate 46 within acceptable limits, while maintaining the structural integrity of the polymeric bodies 50. The maximum base extent 56 is at least extensive enough to provide an adequate bond between the substrate 46 and the polymeric body 50, but not so great as to interfere with any adjacent components (not shown) on the substrate 46.

As illustrated in FIG. 2, each polymeric body 50 optimally has a height extent 52 from the substrate 46 to a package top of the integrated circuit component 20. The height extent 52 lies in one or more planes which are perpendicular to the plane of the substrate 46.

Each polymeric body 50 adhesively extends onto at least one perimetric side 24 to provide adequate bonding between each polymeric body 50 and the integrated circuit component 20. Each polymeric body 50 contacts the perimetric side 24 at a bonding surface area that meets or exceed a minimum surface area required for adequate bonding between each polymeric body 50 and the integrated circuit component 20.

The polymeric bodies 50 are preferably composed of an elastomer or a thermoplastic elastomer that adequately adheres to the substrate 46 and the integrated circuit component 20 based on the materials used for of the substrate 46 and integrated circuit component 20 and their respective surface definitions. The polymeric material preferably has an appropriate tensile modulus and shear modulus to maintain contact between the conductive members 32 and the bond pads 26 despite shifts in the relative position of the integrated circuit component 20 and substrate 46, because of mechanical forces asserted on the assembly or differential thermal expansion of the members during operation. Moreover, the polymeric material is selected to have a coefficient of thermal expansion which is compatible with the integrated surface component and the substrate 46 to minimize unwanted stress during and after cure.

The polymeric material has a predetermined precure to post-cure shrinkage to place or urge the integrated circuit component 20 in compressive contact between the conductive members 32 and the bond pads 26. The predetermined pre-cure to postcure shrinkage is generally defined as a ratio from approximately 1.5 to 1 to approximately 3 to 1, respectively, in a planar spatial dimension. In this regard, in an alternate embodiment, an alternate polymeric body 50 may have two components: (1) a prestreched, shrinkable polymeric cable and (2) a polymeric adhesive. The prestretched, shrinkable polymeric cable, which returns to its original unelongated shape and size upon exposure to heat, may be used in conjunction with the polymeric adhesive for attachment of the shrinkable polymeric cable as guyed supports to the integrated circuit component 20 and the substrate 46.

The polymeric bodies 50 may comprise a silicone-based polymer. In an alternate embodiment, alternate polymeric bodies are formed from a thermoplastic resin or a thermoplastic blend that is readily removed from the substrate 46 to permit repair of the microelectronic assembly. In yet another alternate embodiment, the alternate polymeric bodies contain dispersed metallic particles, such as aluminum or magnesium particles, to conduct heat away from the integrated circuit die to the substrate 46.

The microelectronic assembly provides a robust, reliable electrical connection for connecting traces of a substrate 46 to an integrated circuit component 20. By eliminating or minimizing reflow during manufacturing, the microelectronic assembly particularly reduces solder defects in fine pitch technology, including fine pitches of equal to or less than 153 microns. The microelectronic assembly offers excellent resistance to thermal and mechanical stress. For example, the slidable electrical contacts 72 slide to accommodate applied stress, while maintaining electrical continuity. The microelectronic assembly resists stress damage from differential thermal coefficients of expansion of the integrated circuit component with respect to the substrate 46, which have often caused solder joint failure in the past.

Figure 3:
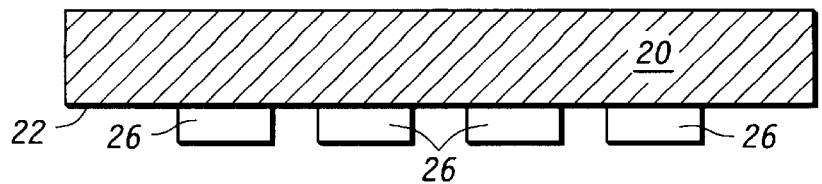
FIG. 3 through FIG. 6 are cross-sectional views illustrating various steps in fabricating the microelectronic assembly of FIG. 1.

FIG. 3 through FIG. 6 show illustrative steps in the method of fabricating a microelectronic assembly of FIG. 1 and FIG. 2. FIG. 3 concerns the step of fabricating an integrated circuit component 20 having bond pads 26. The integrated circuit component 20 is fabricated with a face 22 and bond pads 26 arranged on the face 22 in a second pattern. The face 22 is bounded by perimetric sides 24.

Figure 4:
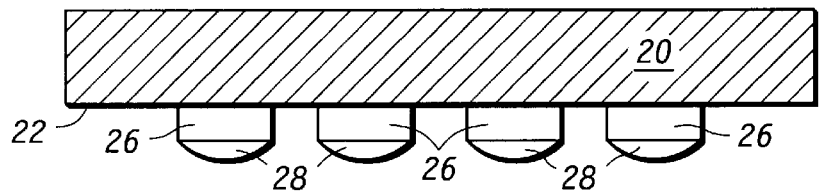
Figure 5:
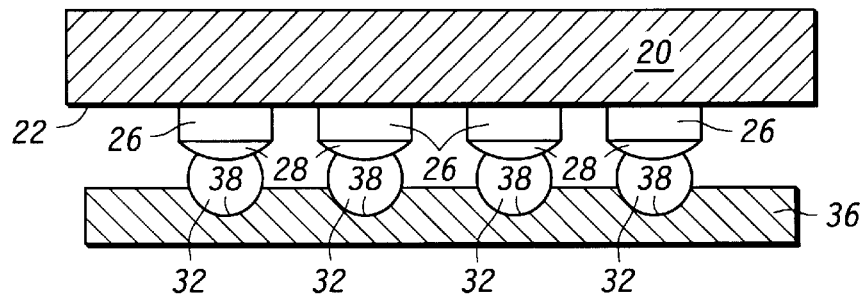

FIG. 4 and FIG. 5 concern the step of attaching conductive members 32 onto the bond pads 26. FIG. 4 shows the bond pads 26 are first coated with a conductive adhesive 28. The conductive adhesive 28 comprises a tacky medium that conducts both direct current and alternating current electricity. The conductive adhesive 28 may be applied by stenciling the conductive adhesive 28 onto the bond pads 26, dipping the bond pads 26 into a bath of conductive adhesive 28, or by analogous methods. The conductive adhesive 28 is typically cured at a predesignated temperature for a predesignated duration.

FIG. 5 illustrates the attaching of conductive members 32 onto corresponding ones of the bond pads 26. A template 36 is used to align the conductive members 32 in an arrangement corresponding to the second pattern. The template 36 has recesses 38 for aligning the conductive members 32 in the arrangement corresponding to the second pattern of the bond pads 26. The recesses 38 are preferably semi-spherical. The template 36 is preferably constructed from a metal or another material with a suitably low coefficient of thermal expansion relative to the integrated circuit component 20 to achieve the precise placement tolerances that are associated with fine-pitch technology (FPT).

Figure 6:
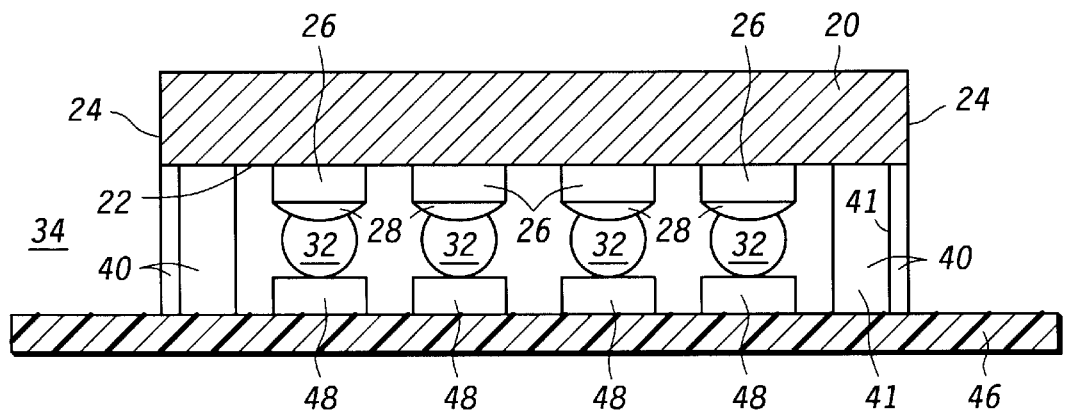

FIG. 6 illustrates superposing the integrated circuit component 20 onto a substrate 46 having terminals 48 disposed in the first pattern generally corresponding to the second pattern of the bond pads 26. The integrated circuit component 20 is superposed such that the conductive members 32 make compliant contact with respective ones of the terminals 48 to form electrical connections and to form a preassembly 34. No conductive adhesive or solder bonding is required between the conductive members 32 and the corresponding terminals 48 at the slidable electrical contacts 72. The outer sides 41 of the polymeric preforms 40 are optimally placed coincidentally with the corners 42 of the integrated circuit component 20 to limit the boundaries of the polymeric bodies 50 in subsequent steps. A preferred illustrative method of placing the polymeric preforms 40 involves affixing the polymeric preforms 40 to the face 22 of the integrated circuit component 20 prior to superposition or placement of the integrated circuit component 20 onto the substrate 46.

Following the placement of the polymeric preforms 40, polymeric material, or its precursor, is dispensed to form polymeric bodies 50. The polymeric preforms 40 may not be necessary if the polymeric material is precisely dispensed and if the polymeric material has a sufficiently high viscosity to limit the maximum base extent 56 of the polymeric bodies 50 to an acceptable, predetermined value. Pressure or clamps may be applied to the integrated circuit component 20 to urge the conductive members 32 of the integrated circuit component 20 toward the terminals 48 of substrate 46 during the curing, cooling, or cross-linking of the polymeric bodies 50. After application of the polymeric material, the polymeric material is typically cured as necessary to adhesively bond the integrated circuit component 20 to the substrate 46 to form the microelectronic assembly. The polymeric bodies 50 cure or cool to resiliently apply a compressive force that presses the conductive members 32 firmly against the terminals 48.

FIGS. 1 and 2 show the complete microelectronic assembly after dispensing and curing polymeric bodies 50 at sites about perimetric sides 24 of the integrated circuit component 20 to form slidable electrical contacts 72 between the conductive members 32 and the terminals 48. The foregoing method may be used to produce variations of the microelectronic assembly. For example, the method may be varied by attaching the conductive members 32 with solder after applying a solder paste 62 to the bond pads 26. The solder paste 62 has sufficient tackiness to maintain the relative positions of the conductive members 32 until the conductive members are reflowed or soldered to the corresponding bond pads 26.

Figure 7:
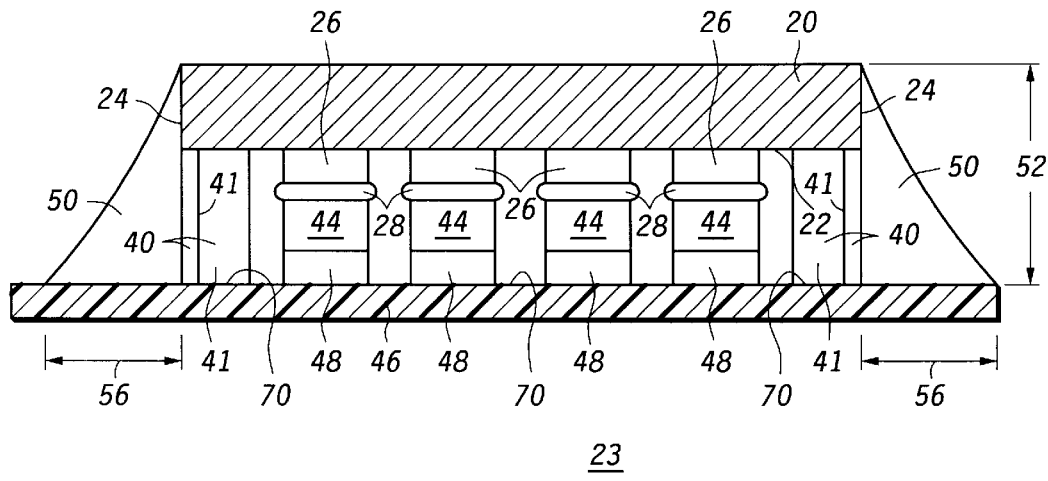
FIG. 7 is a cross-sectional view of a second embodiment of the microelectronic assembly of this invention.
Figure 8:
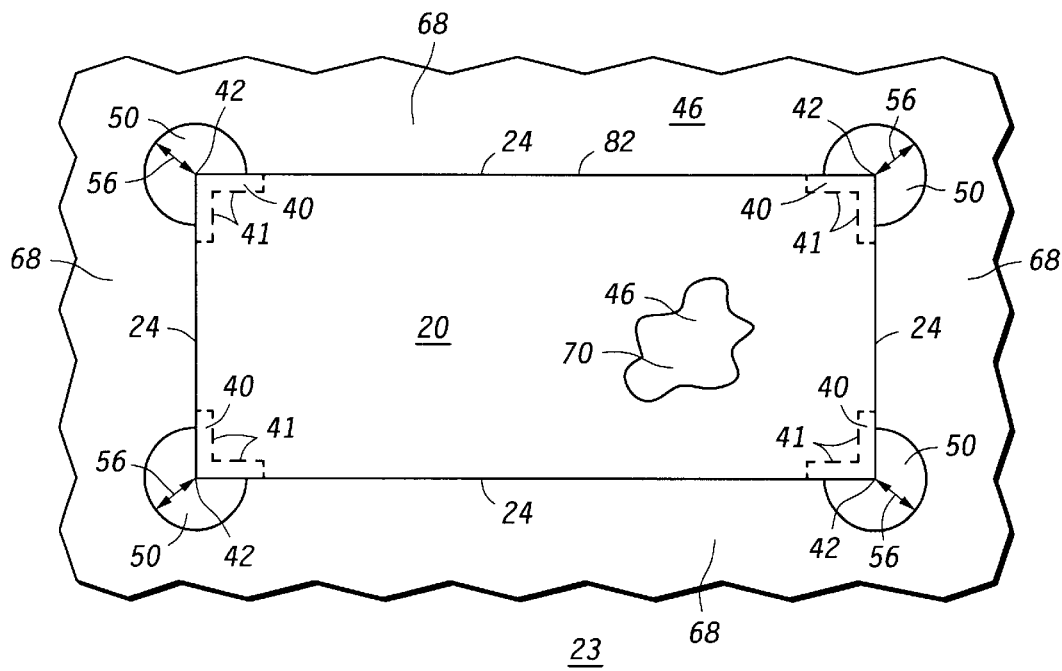
FIG. 8 is a plan view of the second embodiment of the microelectronic assembly in FIG. 7.
Figure 9:
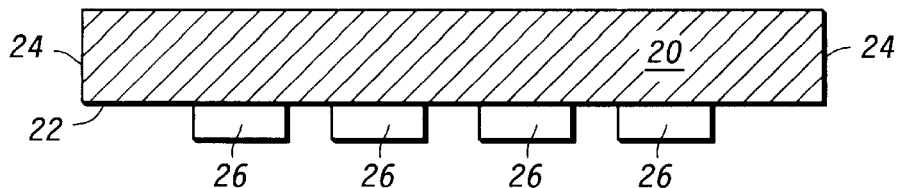
FIG. 9 through FIG. 12 are cross-sectional views illustrating steps in fabricating the second embodiment of the microelectronic assembly of FIG. 7.
Figure 10:
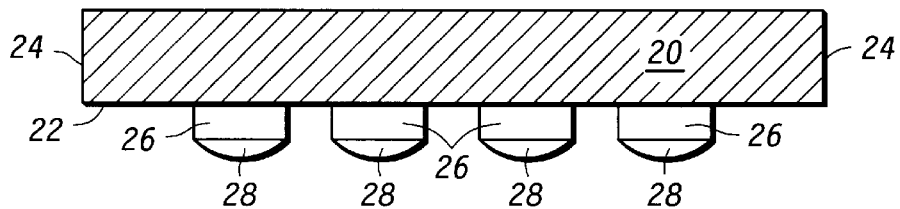
Figure 11:
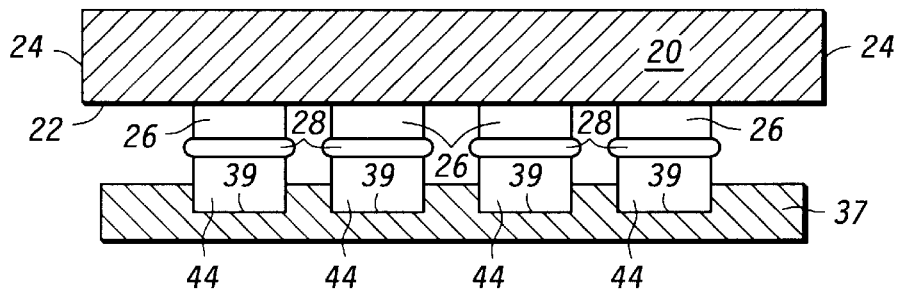
Figure 12:
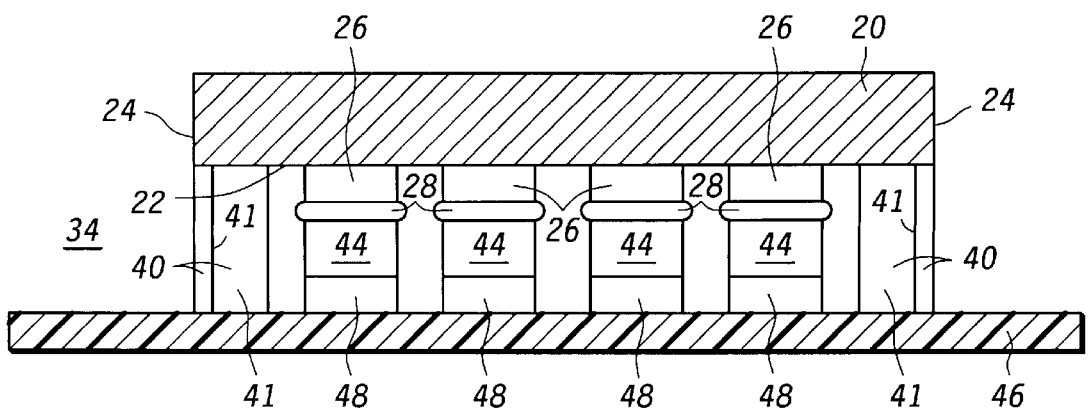

A second embodiment of the microelectronic assembly 23 is illustrated in FIG. 7 and FIG. 8. The second embodiment of the microelectronic assembly 23 is similar to the first embodiment of the microelectronic assembly 21 except the conductive members 44 of the second embodiment are preferably substantially columnar conductive members 44, while the conductive members 32 of the first embodiment are spherical conductive members 32. The columnar conductive members 44 preferably are generally cylindrical and are attached to corresponding bond pads 26 preferably through a conductive adhesive 28. The conductive adhesives 28 described with reference to the first embodiment are equally applicable to the second embodiment.

FIG. 8 shows a top plan view of a microelectronic assembly 23 of the second embodiment. In particular, FIG. 8 shows four corners 42 of a rectangular integrated circuit component 20 optimally secured to the substrate 46 via four polymeric bodies 50.

FIG. 9 through FIG. 12 illustrate the fabrication of the second embodiment of the microelectronic assembly 23 shown in FIG. 7 and FIG. 8. The fabrication of the second embodiment involves the same steps illustrated in FIG. 3 through FIG. 6, except that the conductive members 44 in FIG. 9 through FIG. 12 are generally columnar. In addition, a template 37 has generally cylindrical recesses 39 corresponding in size and shape to the columnar conductive members 44.

Figure 13:
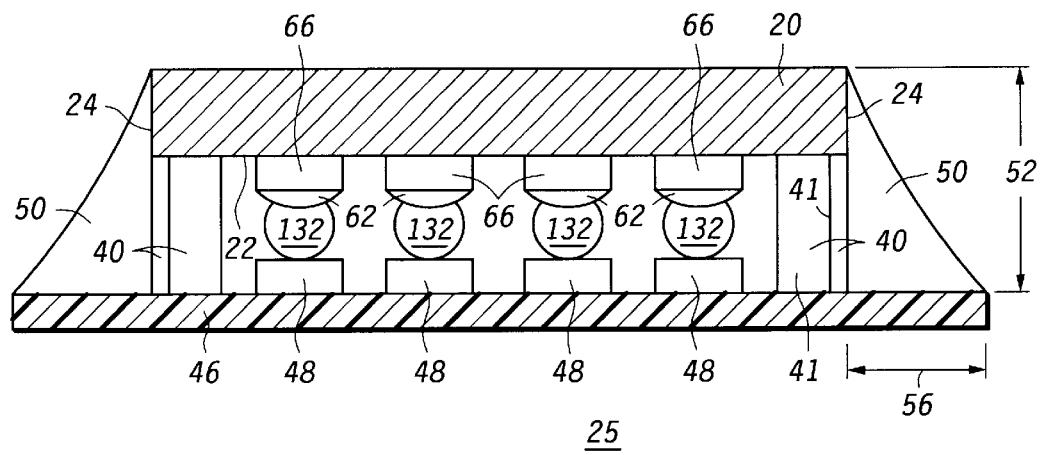
FIG. 13 shows a cross-sectional view of a third embodiment of the microelectronic assembly of this invention.
Figure 14:
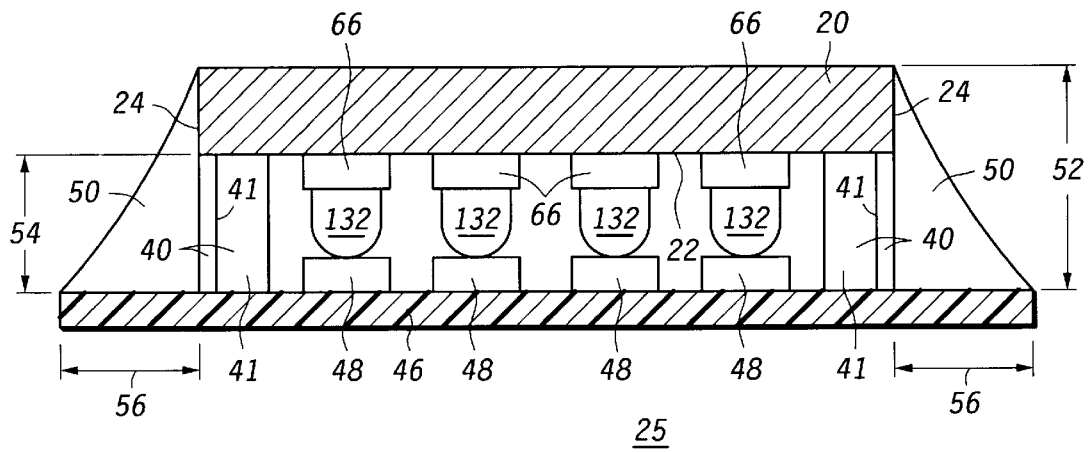
FIG. 14 shows a cross-sectional view of the assembly in FIG. 13 after processing.

FIG. 13 and FIG. 14 show a third embodiment of the microelectronic assembly 25 in which spherical conductive members 132 are attached to solderable bond pads 66 via reflowing, soldering, welding, brazing, or the like. The third embodiment differs from the first embodiment and the second embodiment in that the third embodiment does not use a conductive adhesive to connect the spherical conductive members 132 to the solderable bond pads 66. The solderable bond pads 66 are solder-wettable and must have an adequate thickness to permit soldering. The parameters of the solderable bond pads 66 are comparable to the parameters of the solder pads 26 of the first embodiment so long as the solderable bond pads 66 independently retain their adequate thickness to permit soldering and their solder-wettable attributes.

FIG. 13 shows the microelectronic assembly 25 prior to bonding the spherical conductive members 132 to the solderable bond pads 66. In contrast, FIG. 14 shows the microelectronic assembly 25 after bonding or reflowing the spherical conductive members 132 to the solderable bond pads 66. The formerly globular, spherical conductive members 132 of FIG. 13 may subsequently take on a generally semi-spherical, curved, semi-ellipsoidal, or somewhat cylindrical shape after reflowing or soldering as best illustrated in FIG. 14. The deformed spherical conductive members 132 of FIG. 14 may be referred to as solder bumps having tips.

The spherical conductive members 132 of the third embodiment are preferably composed of a conventional solder, a high temperature solder, a solder material, a solder alloy, a solderable material, or the like. For example, lead-tin or eutectic lead-tin solder may be used for the spherical conductive members 132. The melting point of the solder material used for the spherical conductive members 132 should be above the minimum cure temperature, if any, required for the polymeric material so the spherical conductive members 132 and the polymeric material can be processed simultaneously. In alternate embodiments, alternate spherical conductive members of the third embodiment may comprise a metal, a metallic-coated dielectric core, a solder alloy, copper, nickel, brass, bronze, or the like. For instance, the alternate spherical conductive members comprise a dielectric globular core coated with a corrosion-resistant material, such as a noble metal layer.

Suitable solder pastes 62 are applied to the solderable bond pads 66 and/or the conductive members 132 prior to soldering or reflowing. Suitable solder pastes 62 include type 4 particle distribution in an indium-type 51 C paste. The solder pastes 62 may be applied, for example, by stenciling the solder paste 62 or dipping the integrated circuit component 20 into the solder paste 62. The solder paste 62 preferably remains tacky until reflow to keep the conductive members 132 appropriately positioned with respect to the solderable bond pads 66.

Like reference numerals in the third embodiment and the first embodiment indicate like features. For example, the integrated circuit component 20, the substrate 46, and the terminals 48 described in conjunction with the first embodiment are equally applicable to the third embodiment.

Figure 15:
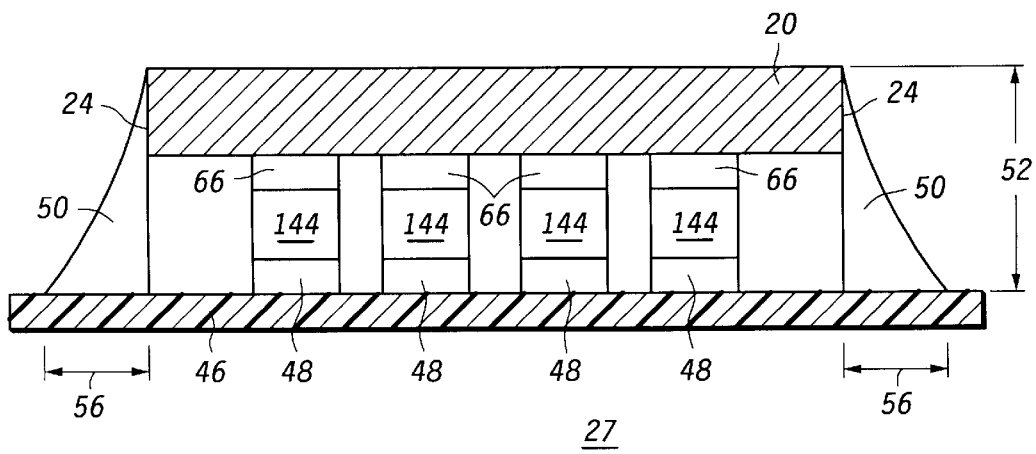
FIG. 15 shows a cross-sectional view of a fourth embodiment of the microelectronic assembly of this invention.

FIG. 15 shows a fourth embodiment of the microelectronic assembly 27 in which columnar conductive members 144 are attached to solderable bond pads 66 via soldering, welding, brazing, or the like. The fourth embodiment differs from the first embodiment and the second embodiment in that the fourth embodiment does not use a conductive adhesive to connect the conductive members 144 to the solderable bond pads 66. The substrate 46 and the terminals 48 described in conjunction with the first embodiment are equally applicable to the fourth embodiment. The solderable bond pads 66 and the solder paste 62, which were described in conjunction with the third embodiment, are equally applicable to the fourth embodiment.

The columnar conductive members 144 of the third embodiment are preferably composed of a conventional solder, a high temperature solder, a solder material, a solder alloy, a solderable material, or the like. For example, lead-tin or eutectic lead-tin solder may be used for the columnar conductive members 144. The melting point of the solder material used for the columnar conductive members 144 should be above the minimum cure temperature required for the polymeric material to permit the simultaneous processing of the polymeric material and the bonding of the columnar conductive members 144. The solder paste 62 preferably remains tacky until reflowing or soldering to keep the columnar conductive members 144 appropriately positioned with respect to the solderable bond pads 66. In alternate embodiments, alternate columnar conductive members of the fourth embodiment may comprise a metal, a metallic-coated dielectric, copper, nickel, brass, bronze, or the like.

Figure 16:
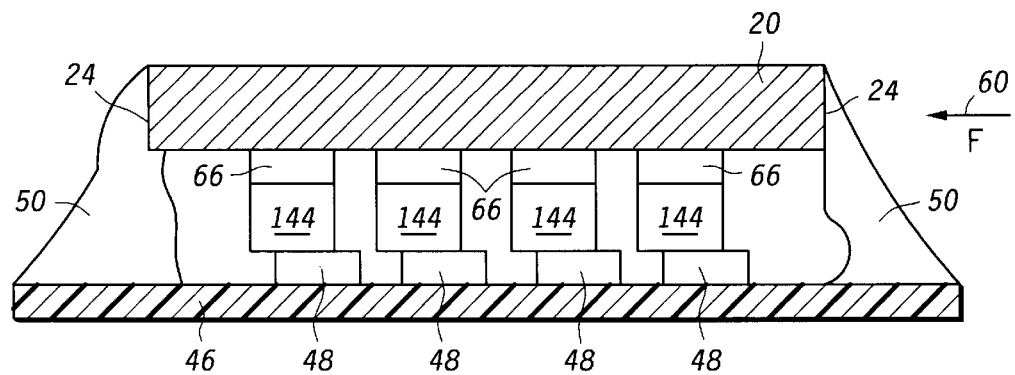
FIG. 16 shows a cross-sectional view of the assembly of FIG. 15 in the presence of applied mechanical stress.

FIG. 16 shows a lateral force (F) applied to the integrated circuit component 20 relative to the substrate 46. The direction of the lateral force is shown by the large arrow labeled 60. The stress may be the result of mechanical stress factors. As shown, the displacement caused by the mechanical stress may be exaggerated to illustrate the operation of the present invention. The microelectronic assembly 27 retains compliant electrical contact between the conductive members and the terminals 48 by sliding to accommodate the stress. Overlap and electrical continuity between the conductive members and the terminals 48 is maintained. If the polymeric bodies 50 are sufficiently resilient or if an elastomer is used for the polymeric bodies 50, the microelectronic assembly 27 will tend to return to the normal stress-free alignment of FIG. 15 after the stress is removed.

The columnar conductive members 44 and 144 of the second and fourth embodiments, respectively, offer a greater potential surface area than the other embodiments for compliant mechanical contact when the substrate 46 and the integrated circuit component 20 are misaligned from stress application as best illustrated in FIG. 16. However, if the spherical conductive members 132 are soldered or reflowed to the solderable bond pads 66 as in the third embodiment, the formerly globular, spherical conductive members 132 may subsequently take on generally semi-spherical or somewhat cylindrical shape after reflowing as previously described.

Figure 17:
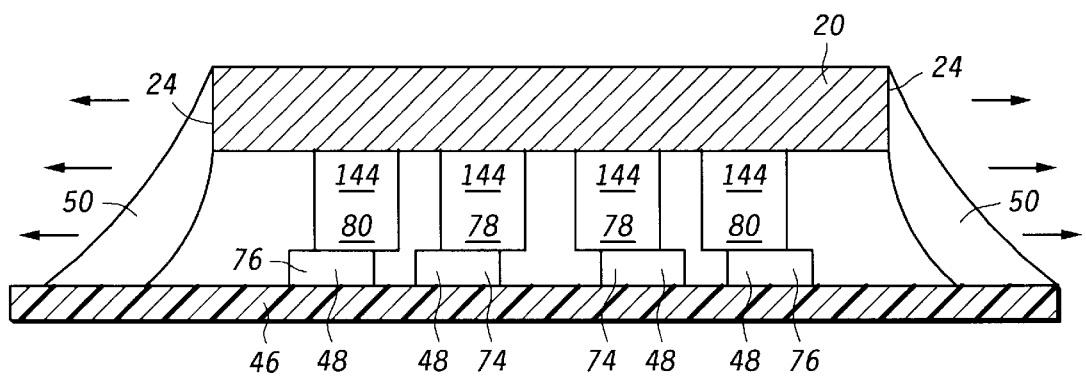
FIG. 17 shows a cross-sectional view of the assembly of FIG. 15 in the presence of thermal stress from differential coefficients of thermal expansion.

FIG. 17 shows a cross-sectional view of the fourth embodiment in the presence of stress from differential coefficients of thermal expansion with respect to the substrate 46 and the integrated circuit component 20. The substrate 46 has a first coefficient of thermal expansion, while the integrated circuit component 20 has a second coefficient of thermal expansion. The first coefficient of thermal expansion is typically based upon the coefficient of thermal expansion for a polymer or another substrate material.

In contrast, the second coefficient of thermal expansion is typically based upon silicon (Si) or gallium arsenide (GaAs). If the first coefficient of thermal expansion is sufficiently greater than the second coefficient of thermal expansion, the difference in the coefficients of thermal expansion produces a lateral displacement or sliding of the outer terminals 76 with respect to the conductive members 144. Inner terminals 74 and inner conductive members 78, which are centrally located relative to the integrated circuit component 20, experience less relative lateral movement than the outer terminals 76 and their associated outer conductive members 80 as best illustrated in FIG. 17.

The slidable contacts of FIG. 17 relieve stress by permitting lateral movement between the terminals 48 and the conductive members 144. In contrast, prior art electrical interconnections (i.e. solder joints or conductive adhesives) between an integrated circuit die and a circuit board often experience warpage of the circuit board from stress caused by differential coefficients of thermal expansion. The warpage of prior art microelectronic assemblies tends to break or fracture the electrical interconnections; hence, leads to open circuits or circuitry failure.

Various illustrative embodiments of the microelectronic assembly and the method for forming the microelectronic assembly have been described in this specification. Additional variations in the embodiments and processes described above may be apparent from this specification. Accordingly, the scope of the present invention is defined primarily by reference to the following claims which are further exemplary of the present invention.

The following is claimed:

1. A microelectronic assembly comprising:
    a substrate having terminals arranged in a first pattern;
    an integrated circuit component having a face facing the substrate and spaced apart from the substrate, perimetric sides about the face, and bond pads; the bond pads arranged in a second pattern corresponding to the first pattern;
    a plurality of conductive members bonded to the bond pads; the conductive members resting against the terminals to form slidable electrical contacts; and
    a plurality of polymeric bodies bonded to the perimetric sides and the substrate, each of the polymeric bodies attaching the integrated circuit component to the substrate.

2. The microelectronic assembly of claim 1 wherein the polymeric bodies are spatially isolated from the conductive members.

3. The microelectronic assembly of claim 1 wherein the integrated circuit component comprises at least two corners at intersections between the perimetric sides; and wherein said polymeric bodies are disposed at the corners.

4. The microelectronic assembly of claim 1 wherein the polymeric bodies are composed of an elastomer effective to maintain mechanical contact between the conductive members and corresponding ones of the terminals.

5. The microelectronic assembly of claim 1 wherein the polymeric bodies are formed of an elastomer with a predetermined pre-cure to post-cure shrinkage effective to press the conductive members against corresponding ones of the terminals after curing of the elastomer.

6. The microelectronic assembly of claim 1 wherein the polymeric bodies are generally semi-conical; and wherein the polymeric bodies are composed of a thermoplastic elastomer.

7. The microelectronic assembly of claim 1 further comprising a conductive adhesive bonding the conductive members to the bond pads.

8. The microelectronic assembly of claim 1 wherein the conductive members are solderable; and wherein the conductive members are soldered to the bond pads.

9. The microelectronic assembly of claim 1 wherein the conductive members comprise metallic, substantially columnar members.

10. The microelectronic assembly of claim 1 wherein the conductive members comprise metallic, substantially spherical members.

11. The microelectronic assembly of claim 1 wherein the slidable electrical contacts comprise first mating surfaces of the conductive members and corresponding second mating surfaces of the terminals, respectively; and wherein the first mating surfaces and the second mating surfaces are composed of corrosion-resistant metallic layers.

12. The microelectronic assembly of claim 1 wherein each of the polymeric bodies has a maximum base extent from the perimetric sides within a range from approximately 380 microns to 1525 microns.

13. A microelectronic assembly comprising:
    a substrate having terminals arranged in a first pattern, a component-shadow region, and a component-attach region bounding the component-shadow region;
    an integrated circuit component having a face facing and spaced apart from the component-shadow region by a gap, perimetric sides about the face, and bond pads arranged on the face in a second pattern corresponding to the first pattern;
    a plurality of conductive members bonded to the bond pads; the conductive members resting against the terminals to form slidable electrical contacts, the slidable electrical contacts including mating surfaces of the conductive members remote from their associated bond pads;
    a plurality of polymeric bodies adhesively bonded to the perimetric sides and within the component-attach region to attach the integrated circuit component to the substrate; and
    a preform disposed within the gap to spatially isolate at least one of the polymeric bodies from the conductive members.

14. The microelectronic assembly of claim 13 wherein the preform prevents at least one of the polymeric bodies from extending into the component-shadow region, the component-shadow region defined by projecting a perimetric outline, of the integrated circuit component, onto the substrate.

15. The microelectronic assembly of claim 13 wherein each of the polymeric bodies extends between at least one of the perimetric sides and the component-attached region, the polymeric bodies minimally intruding into the component-shadow region.

16. The microelectronic assembly of claim 13 wherein the preform comprises a compressible mold.

17. The microelectronic assembly of claim 13 wherein the integrated circuit component further comprises a package and wherein the preform is incorporated into the package, outer sides of the preform being substantially coextensive with the perimetric sides; the preform bounding at least one of said polymeric bodies.

18. The microelectronic assembly of claim 13 wherein the preform is integrated into the substrate and extends from the substrate toward the integrated circuit component, the preform bounding at least of said polymeric bodies.

19. The microelectronic assembly of claim 13 wherein each of the conductive members has a shape selected from the group consisting of substantially spherical and substantially columnar.

20. The microelectronic assembly of claim 13 wherein the conductive members are fused to the bond pads.

21. The microelectronic assembly of claim 13 further comprising a conductive adhesive bonding the conductive members to the bond pads.

22. A microelectronic assembly comprising:
   a printed circuit board having terminals arranged in a first pattern, a component-shadow region, and a component-attach region; the component-attach region bounding the component shadow region;
   an integrated circuit die having a generally rectangular face and spaced apart from the component-shadow region by a gap, bond pads arranged in a second pattern on the face corresponding to the first pattern, and perimetric sides intersecting the face;
   a plurality of generally spherical conductive members adhesively bonded to the bond pads; said spherical conductive members resting against corresponding ones of the terminals to form slidable electrical contacts;
   polymeric bodies adhesively bonded to the perimetric sides and the component attach region, each of the polymeric bodies securing the integrated circuit die to the printed circuit board.

23. The microelectronic assembly of claim 22 wherein each of the spherical conductive members comprises a dielectric interior and a conductive exterior predominately or completely covering the dielectric interior, the conductive exterior comprising a metallic coating.

24. The microelectronic assembly of claim 22 wherein the spherical members are soldered to the bond pads by reflowing the spherical members to the bond pads.

25. A microelectronic assembly comprising:
   a printed circuit board having terminals arranged in a first pattern, a component-shadow region, and a component-attach region bounding the component-shadow region;
   an integrated circuit die having a substantially rectangular face facing and spaced apart from the component-shadow region by a gap, bond pads arranged in a second pattern on the face corresponding to the first pattern, and perimetric sides intersecting the face;
   a plurality of substantially columnar conductive members bonded to the bond pads; the columnar conductive members having tips resting against the terminals to form slidable electrical
   polymeric bodies adhesively bonded to the perimetric sides and the component-attach region, each of the polymeric bodies securing the integrated circuit die to the circuit board.

26. The microelectronic assembly of claim 25 further comprising a conductive adhesive, the conductive adhesive bonding the columnar conductive members to the bond pads.

27. A method for manufacturing a microelectronic assembly, the method comprising the steps of:
   a) fabricating an integrated circuit component comprising a face and bond pads arranged on the face;
   b) attaching conductive members onto said bond pads;
   c) superposing the integrated circuit component onto a substrate such that said conductive members rest against said terminals to form slidable electrical contacts;
   d) dispensing polymeric material about the integrated circuit component to form polymeric bodies bonding the integrated circuit component to the substrate.

28. The method according to claim 27 wherein the step b of attaching the conductive members comprises applying a conductive adhesive to the bond pads.

29. The method according to claim 28 wherein the step d of dispensing further comprises dispensing a curable elastomer as the polymeric material; and further comprising the step of:
   f) curing the polymeric material to form the polymeric bodies.

30. The method according to claim 27 wherein the step b of attaching the conductive members comprises applying a solder paste to the bond pads and reflowing the conductive members to bond the conductive members to the bond pads.

31. The method according to claim 27 wherein the step b of attaching the conductive members comprises attaching spherical members as the conductive members.

32. The method according to claim 27 wherein the step of b of attaching the conductive members comprises attaching a columnar metallic members as the conductive members.

33. The method according to claim 27 wherein the step d of dispensing polymeric material comprises securing the integrated circuit component to the substrate by an elastomer having a predetermined pre-cure to post-cure shrinkage rate effective to place the conductive members in compressive contact with the terminals.

34. The method according to claim 27 wherein the step a of fabricating the integrated circuit component is accomplished by fabricating a generally polyhedral device with four corners; and wherein the step d of dispensing polymeric material further comprises securing the integrated circuit component by placing the polymeric material at each of the four corners.

35. The method according to step 27 wherein the step b of attaching the conductive members to the bond pads is accomplished by aligning the integrated circuit component with respect to a template containing the conductive members in one arrangement mirroring the pattern of the plurality of bond pads.

36. The method according to claim 27 wherein the step b of attaching the conductive members comprises attaching solderable conductive members to the bond pads and further comprising the step of:
   f) solder bonding the solderable conductive members prior to the step c of superposing the integrated circuit component.

* * * * *

UNITED STATES PATENT AND TRADEMARK OFFICE
CERTIFICATE OF CORRECTION

PATENT NO. : 6,046,910
DATED : Apr. 4, 2000
INVENTOR(S) : Ghaem et al.

It is certified that error appears in the above-indentified patent and that said Letters Patent is hereby corrected as shown below:

Column 13, line 67 reads "form slidable electrical"

should read --form slidable electrical contacts;--

Signed and Sealed this

Sixth Day of March, 2001

Attest:

NICHOLAS P. GODICI

Attesting Officer

Acting Director of the United States Patent and Trademark Office